United States Patent
Djahanshahi et al.

(10) Patent No.: US 7,088,796 B2
(45) Date of Patent: Aug. 8, 2006

(54) PHASE DETECTOR CUSTOMIZED FOR CLOCK SYNTHESIS UNIT

(75) Inventors: Hormoz Djahanshahi, Coquitlam (CA); Graeme Boyd, North Vancouver (CA); Victor Lee, Burnaby (CA)

(73) Assignee: PMC-Sierra Ltd. (CA)

( * ) Notice: Subject to any disclaimer, the term of this patent is extended or adjusted under 35 U.S.C. 154(b) by 594 days.

(21) Appl. No.: 10/106,437

(22) Filed: Mar. 27, 2002

(65) Prior Publication Data

US 2002/0154722 A1    Oct. 24, 2002

(30) Foreign Application Priority Data

Apr. 19, 2001    (CA) .................................... 2344787

(51) Int. Cl.
*H03D 3/24*    (2006.01)

(52) U.S. Cl. ................... 375/376; 375/316; 375/327; 375/362; 331/11; 331/16; 331/17; 331/18; 331/25; 327/12; 327/17; 327/148; 327/150; 327/157; 327/159

(58) Field of Classification Search ............. 375/316, 375/327, 362, 371, 373, 376; 331/16–18, 331/25, 11; 327/12, 17, 148, 150, 157, 159
See application file for complete search history.

(56) References Cited

U.S. PATENT DOCUMENTS

| | | | |
|---|---|---|---|
| 4,535,459 A | 8/1985 | Hogge, Jr. | |
| 5,027,085 A | 6/1991 | De Vito | |
| 5,159,279 A * | 10/1992 | Shenoi et al. | 327/2 |
| 5,424,689 A * | 6/1995 | Gillig et al. | 331/17 |
| 5,594,762 A * | 1/1997 | Joo et al. | 375/371 |
| 5,770,976 A * | 6/1998 | Nagaraj | 331/1 A |
| 5,933,058 A * | 8/1999 | Pinto et al. | 331/17 |
| 5,945,855 A * | 8/1999 | Momtaz | 327/157 |
| 6,046,646 A * | 4/2000 | Lo et al. | 331/10 |
| 6,177,812 B1 * | 1/2001 | Nagao et al. | 327/7 |
| 6,366,173 B1 * | 4/2002 | Ozawa et al. | 331/11 |
| 6,509,770 B1 * | 1/2003 | Gossmann et al. | 327/157 |
| 6,526,111 B1 * | 2/2003 | Prasad | 375/376 |
| 6,748,027 B1 * | 6/2004 | Kocaman et al. | 375/316 |
| 6,765,445 B1 * | 7/2004 | Perrott et al. | 331/17 |
| 2002/0113631 A1 * | 8/2002 | Gossman et al. | 327/157 |
| 2004/0263146 A1 * | 12/2004 | Boerstler et al. | 324/76.53 |

OTHER PUBLICATIONS

Charles R. Hogge, Jr., "A Self-Correcting Clock Recovery Circuit", Journal of Lightwave Technology, vol. LT-3, No. 6, 1312-1314, Dec. 1985.

* cited by examiner

*Primary Examiner*—Mohammed Ghayour
*Assistant Examiner*—Freshteh Aghdam
(74) *Attorney, Agent, or Firm*—Varmette & Co.

(57) ABSTRACT

A phase detector customized for Clock Synthesis Unit (CSU) is disclosed. The phase detector improves jitter performance by providing minimal activity on VCO control lines and pushing ripple frequency to one octave higher, while maintaining wide linear characteristic. Moreover, it provides a frequency-scalable circuit that unlike a conventional phase-and-frequency detector (PFD), does not rely on asynchronous elements.

7 Claims, 6 Drawing Sheets

PHASE DETECTOR CUSTOMIZED FOR CLOCK SYNTHESIS UNIT

FIELD

This invention relates to a phase detector customized for a Clock Synthesis Unit (CSU).

BACKGROUND

Phase-locked loop (PLL) circuits are used in both clock synthesis and clock recovery circuits. In clock synthesis circuits, a stable reference clock is used to produce an output clock generally of a frequency that is a multiple of the input clock frequency. In clock recovery circuits a data stream, usually Non-Return-to-Zero (NRZ) type, is the input and the clock associated with this input data stream is extracted by the PLL circuit and output.

FIG. 1 shows the block diagram of a phase-locked loop (PLL) consisting of a phase detector 10, a charge pump 12, a loop filter 14, a Voltage-Controlled Oscillator (VCO) 16 and a divide-by-N feedback 18. The phase detector is a key block of the PLL that affects locking properties such as acquisition range and transient response, as well as the jitter performance.

A Phase-and-Frequency Detector (PFD) is widely used in clock synthesizer PLLs, also known as CSUs (Clock Synthesis Units). On the other hand, a Hogge phase detector is an attractive choice for high-speed clock and data recovery circuits, also known as CRUs (Clock Recovery Units). A Hogge phase detector adjusts the edge of extracted clock to be at the center of the data eye and automatically provides built-in data retiming.

Phase-and-Frequency Detector (PFD)

In a conventional CSU based on a PFD and a divide-by-N feedback, the synthesized output frequency is N times the reference frequency: $f_{OUT}=N \times f_{IN}$. FIG. 2a shows a typical PFD circuit combined with switched current sources 20 and 22 representing a charge pump, and a capacitor 24 representing a loop filter. The two inputs to the PFD are a reference clock (REFCLK) 26, and a feedback clock (FBCLK) 28. As shown in FIG. 2b, the rising edge of REFCLK sets the output UP, and the rising edge of FBCLK (i.e. VCO frequency divided by N) sets the output DOWN. Phase error is obtained by comparing the widths of UP and DOWN pulses. At ideal locked condition, the rising edges of REFCLK and FBCLK are perfectly aligned and net output of the charge pump is zero due to complete overlap of UP and DOWN pulses. If FBCLK moves with respect to REFCLK, the position of DOWN pulse moves accordingly and there will be an incremental (positive or negative) charge and voltage adjustment on the capacitor 24 that provides the control voltage $V_C$ to the VCO.

Combined with a charge pump, a PFD potentially suffers from a dead zone in its transfer characteristic, as shown by the solid line in FIG. 2c. The dead zone, which is due to inherent delay in turning on charge pump currents, directly translates to an equivalent peak-to-peak phase jitter in the PLL. To eliminate the dead zone, a larger delay τ is added in the reset path of the PFD. The resulting characteristic is shown with dashed line in FIG. 2c. Despite its popularity, this approach has some drawbacks that are typical of any asynchronous design. As the delay varies over process, temperature and power supply, if it becomes too small at some design corner, the dead zone or nonlinearity will appear there. On the other hand, the delay may not be made arbitrarily large, partly because it will eat into the dynamic range of the PFD from the two sides (see FIG. 2c). From a design point of view, the PFD circuit is not scalable, i.e. for a new frequency or process technology the delay element must be carefully readjusted.

Hogge Phase Detector

FIG. 3a shows the schematic of a Hogge phase detector. An attractive choice for high-speed clock and data recovery, the Hogge circuit adjusts the recovered clock edge at the center of data eye and automatically provides data retiming. For each input (data) transition, an UP pulse is generated at the output, followed by a DOWN pulse, causing a triangle-like activity on $V_C$, i.e. the control voltage of the VCO. When there is no data transition, there is no activity on $V_C$. Typical waveforms are shown in FIG. 3b. If the phase of Din varies (or jitters), the width of UP pulse and the corresponding charge varies, but DOWN pulse is fixed and provides a reference discharge. Thus, at the end of each UP-DOWN sequence there can be a net incremental voltage adjustment on $V_C$. The Hogge phase detector has a linear characteristic with no dead zone as shown in FIG. 3c. However, the Hogge phase detector is not normally used in a low-jitter CSU since the periodic transitions of the reference clock make a triangular ripple always present on the VCO control line, corresponding to a small deterministic clock jitter.

The input dynamic range of a Hogge phase detector is in theory smaller than that of a PFD, i.e. $\pm\pi$ vs. $\pm 2\pi$. In practice the input dynamic range of a PFD is considerably narrowed from each side by the amount dedicated to reset pulse width (which depends on design margin, process, temperature, etc.). Also, the Hogge circuit as a phase detector (as opposed to a frequency detector) requires a frequency acquisition aid. For instance, some CRUs employ a PFD at start-up transient and switch to a Hogge phase detector after the frequency acquisition. In other designs, the center frequency of the VCO is swept by means of its control voltage (or current). In either case, a digital control circuit (a.k.a. digital wrapper) may supervise the transient process and switching action.

It is an object of the invention to realize a phase detector with improved jitter performance for clock synthesis units.

It is a further object of the invention to present a scalable design for the phase detector that does not rely on asynchronous elements.

SUMMARY

The invention consists of a phase detector circuit optimized for a clock synthesis unit (CSU) unlike phase detectors found in the literature which are based on clock recovery units (CRUs), or which do not distinguish between CSU and CRU.

Compared to a conventional PFD, jitter performance is improved by:
 a) pushing out the ripple frequency of the VCO's control line to be one octave higher, thus attenuating the peak-to-peak ripple voltage and corresponding jitter by extra amounts (depending on the loop filter order),
 b) 6 dB less degradation applied to the noise floor (phase noise) of the input reference clock,
 c) ensuring a linear characteristic with no dead zone over process, temperature and power supply variations.

Also, compared to a PFD, a design is presented free from asynchronous elements, such as a reset element, which would involve timing readjustment whenever ported to a different process technology or scaled to operate at a new frequency.

Compared to a Hogge phase detector, the amplitude of voltage ripple on VCO's control line is significantly reduced (virtually eliminated), thus the corresponding clock jitter is greatly attenuated.

BRIEF DESCRIPTION OF THE DRAWINGS

The invention itself both as to organization and method of operation, as well as additional objects and advantages thereof, will become readily apparent from the following detailed description when read in connection with the accompanying drawings.

DETAILED DESCRIPTION OF PREFERRED EMBODIMENT

One preferred embodiment of a phase detector circuit optimized for clock synthesis units (CSUs) treats the reference clock in a CSU as a 'known' input bit pattern comparable to a periodic 1010 input data received by a CRU. Relying on this concept, the Hogge phase detector design is substantially modified. A CSU phase detector is customized for the known 1010 bit pattern so as to eliminate the periodic ripple caused by the phase detector on the VCO's control line. This is achieved by ensuring a complete overlap between UP and DOWN pulses when a PLL utilizing the phase detector is locked to a low-jitter input reference clock.

Figure 4A:
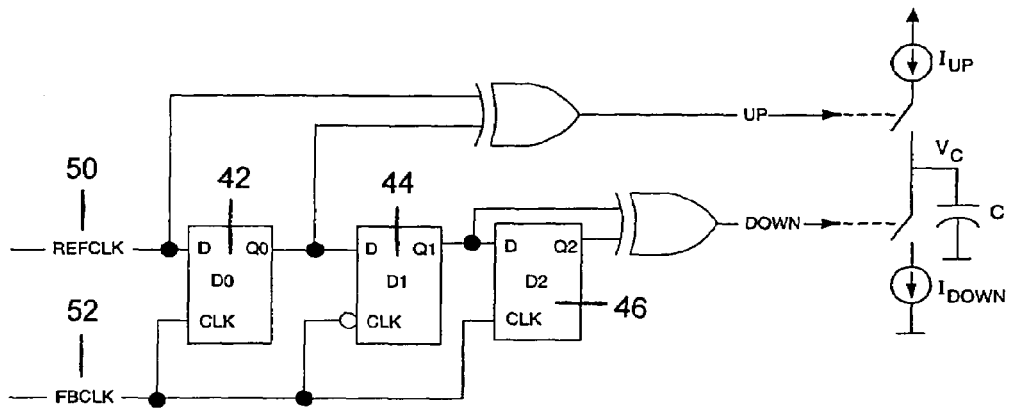
FIG. 4a is a block diagram of the proposed CSU phase detector driving a charge pump.
Figure 4B:
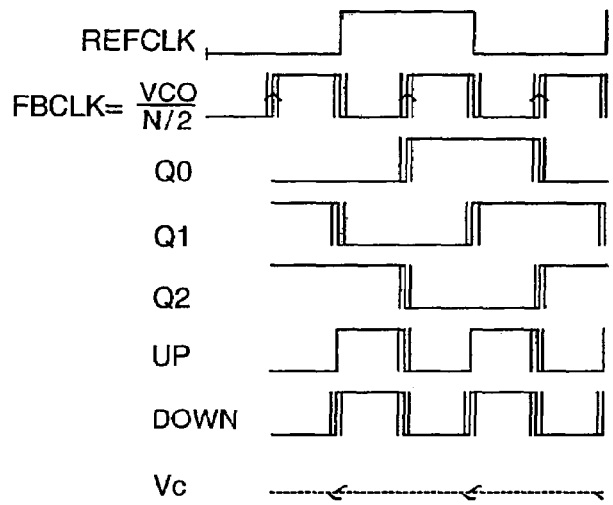
FIG. 4b is a diagram showing the CSU phase detector waveforms.

A schematic of one embodiment of the CSU phase detector is shown in FIG. 4a. The CSU has a VCO that runs at N times the frequency of a reference clock (REFCLK) input 50 ($f_{VCO}=N \times f_{REFCLK}$). There is an assumption that frequency acquisition has been achieved by other means, e.g. by sweeping the VCO's control voltage or by a frequency detector. The reference clock 50 is applied to data input of the first flipflop (D0) 42. The three flipflops 42, 44 and 46 are triggered by alternative edges of a feedback clock (FBCLK) 52. This feedback clock 52 is obtained by dividing the frequency of the VCO by N/2, i.e. $f_{FBCLK}=f_{VCO} \div (N/2)$. In this manner, REFCLK is sampled by FBCLK that has twice as much frequency. Referring to FIG. 4b, this operation generates Q0, Q1 and Q2 waveforms that are successively delayed by half a clock cycle of FBCLK. The phase detector output UP is generated by EXOR (EXclusive OR) operation between REFCLK and Q0. Similarly, DOWN is generated by EXOR operation between Q1 and Q2:

UP=REFCLK⊕Q0

DOWN=Q1⊕Q2

Where the symbol ⊕ represents EXOR.

Similar to a conventional Hogge phase detector each transition, for example, a positive edge of the input (here named REFCLK, instead of Din) triggers an UP followed by a DOWN pulse. In this circuit, however, DOWN is delayed by two (rather than one) half clock cycles of FBCLK. The next transition of the input (negative edge of REFCLK) occurs one period of FBCLK after the first transition (since $f_{FBCLK}=2 \times f_{REFCLK}$) triggering a new UP pulse simultaneously with the previous DOWN pulse. In this manner, UP and DOWN pulses completely overlap at phase-locked condition as shown in FIG. 4b eliminating the Hogge phase detector's triangular waveform on $V_C$. At ideal locked condition, there is no current pumped into loop filter capacitor and thus no activity on $V_C$. If feedback clock FBCLK moves (jitters) with respect to REFCLK, then Q0, Q1 and Q2 will move accordingly. In this case, only the positive edge of UP will be fixed (because REFCLK is fixed) while the negative edge of UP and both edges of DOWN will move together with Q0, Q1, and Q2. Depending on relative position of the positive edges of UP and DOWN, there will be an incremental charge to/from and a correction on the loop filter voltage $V_C$. There will be no correction occurring on the negative edges of UP and DOWN as these two edges move together.

Figure 4C:
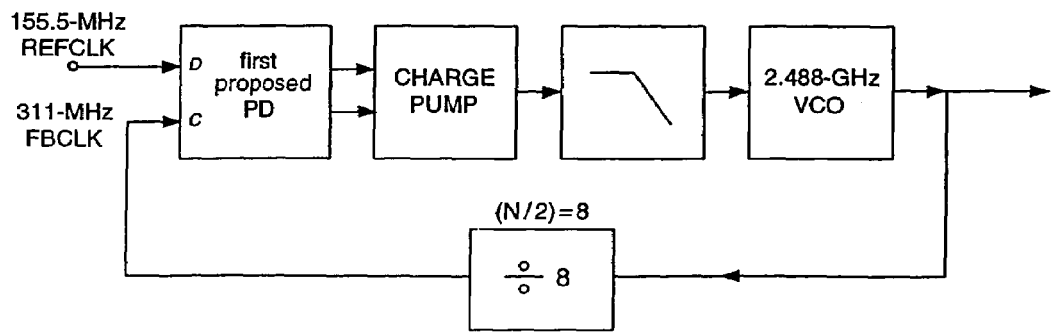
FIG. 4c is a block diagram of the CSU phase detector in a typical application within a CSU.
Figure 5:
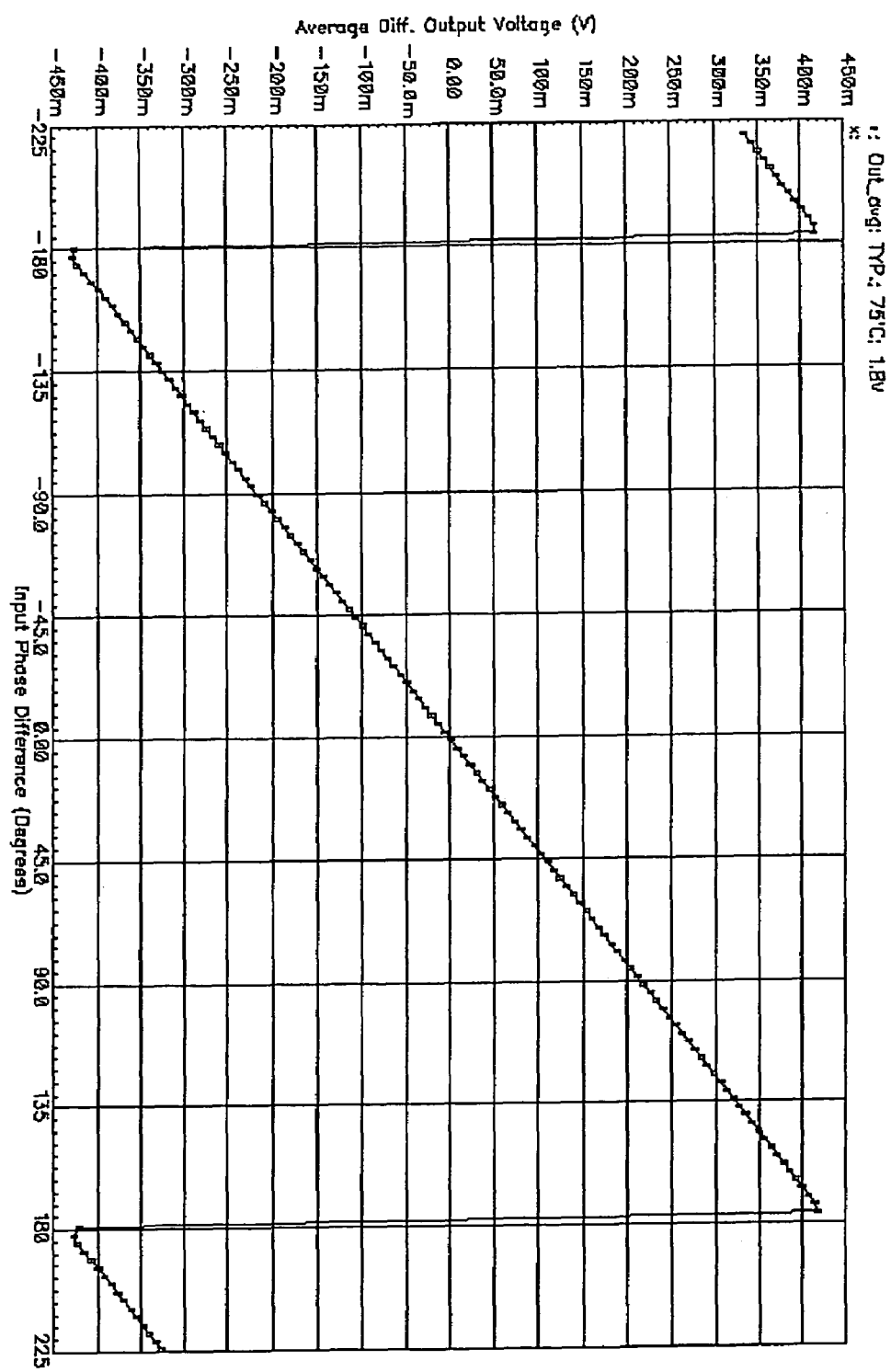
FIG. 5 is a plot of the typical CSU phase detector output characteristic (average differential out voltage vs. input phase difference, where phase is defined with respect to one period of FBCLK in FIG. 4b)

FIG. 4c shows the block diagram of a 2.488-GHz CSU based on the described CSU phase detector, with a 155.5-MHz reference clock and a divide-by-8 feedback. It should be noted that the ratio of the VCO's output frequency to reference clock frequency is N=16 while the feedback divide ratio is N/2=8. This architecture is implemented in PMC-Sierra's PM5284, a SONET OC-48 clock synthesizer in 0.18-μm CMOS. The high-speed logic is implemented based on differential Current-Mode Logic (CML) gates. The frequency acquisition is obtained via a PFD supervised by a digital wrapper controller. A simulated characteristic of the CSU phase detector is plotted in FIG. 5. The plot shows average differential output voltage (UP minus DOWN) vs. input phase error, exhibiting a full-range linear characteristic for the CSU phase detector. Input phase (degrees) on horizontal axis is defined with respect to FBCLK period, which is half of REFCLK period (see FIG. 4b). If input phase error is defined with respect to REFCLK period, the horizontal axis in FIG. 5 should be scaled by 0.5.

Comparison with Hogge Phase Detector

Compared to a conventional Hogge phase detector, the CSU phase detector eliminates the triangular charge and discharge of the loop filter in the PLL while maintaining the full-range linear characteristic. This eliminates the corresponding jitter from phase detector by ensuring minimal activity on the control line of VCO. Similar to Hogge phase detector, the CSU phase detector is somewhat sensitive to duty cycle distortion.

Based on postlayout simulations on PMC-Sierra's PM5284 fully-differential CSU that employs the CSU phase detector, differential voltage ripple on VCO's control lines in the PLL was about 3–5 mVpp. When a conventional Hogge phase detector was used in the CSU simulations, the unwanted differential voltage ripple was increased to 150 mVpp. A higher loop bandwidth usually used in a CSU (compared to a CRU) to attenuate internal VCO's phase noise would aggravate the large ripple problem of a conventional Hogge, because (a) a smaller attenuation is applied to the ripple frequency by loop's low-pass filter; (b) a higher product of charge pump current times loop filter resistor is usually employed (loop bandwidth is proportional to this product) which further increases the triangular voltage ripple on VCO's control line(s).

Comparison with PFD

Compared to a PFD, the advantages of the proposed phase detector employed in a CSU are as follows.

Figure 1:
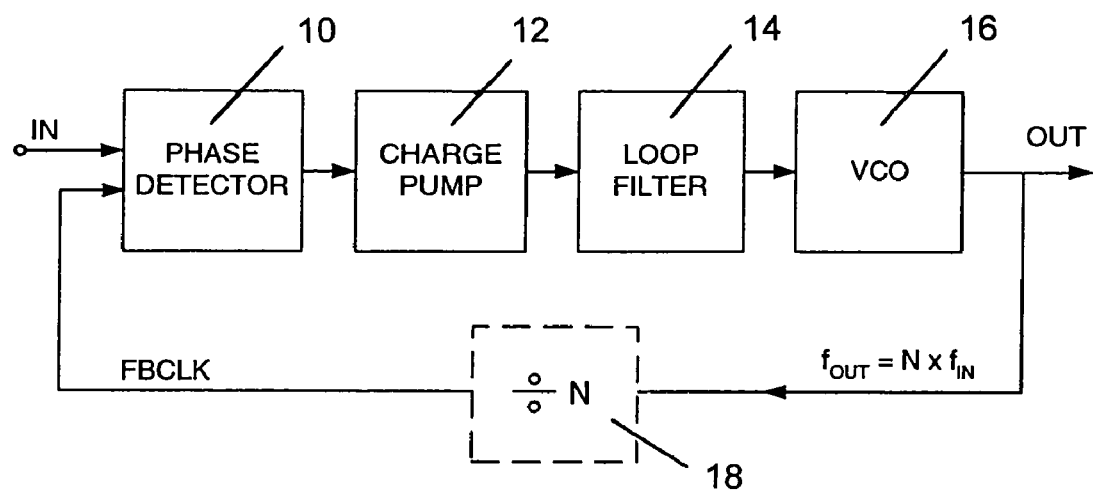
FIG. 1 is a prior art block diagram of phase-locked loop (PLL)
Figure 2A:
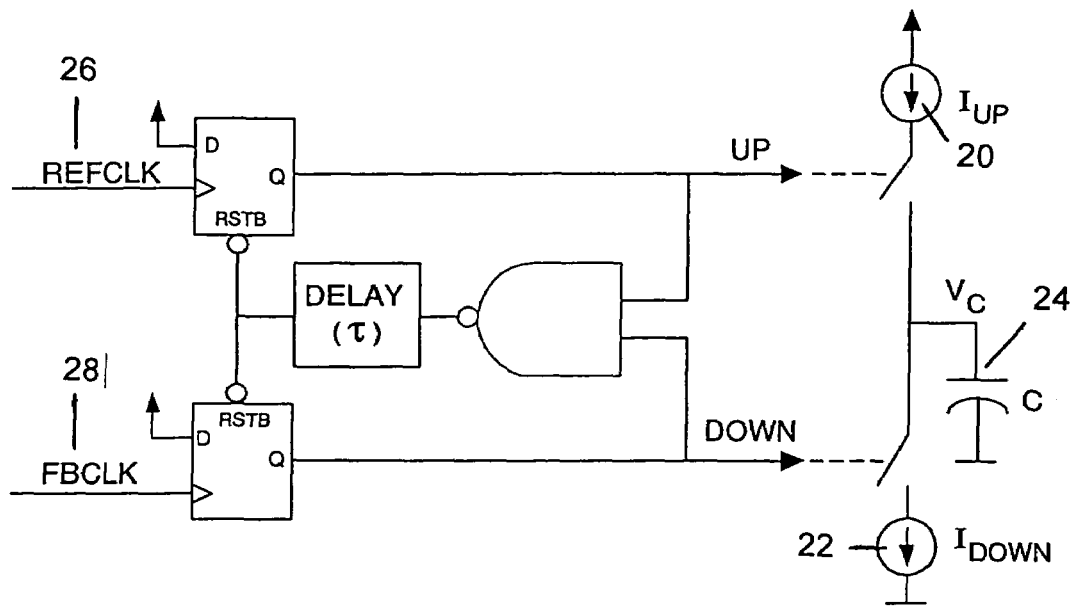
FIG. 2a is a prior art diagram of a Phase-and-Frequency Detector (PFD) controlling a charge pump.
Figure 2B:
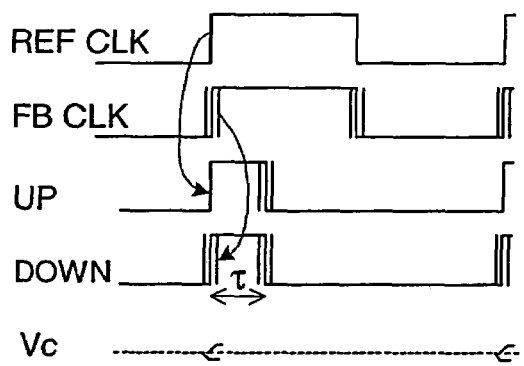
FIG. 2b is a prior art diagram showing the PFD waveforms at near lock condition.
Figure 2C:
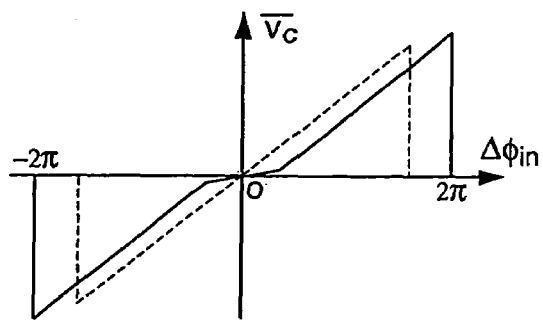
FIG. 2c is a prior art diagram showing a PFD output characteristic vs. input phase error.
Figure 3A:
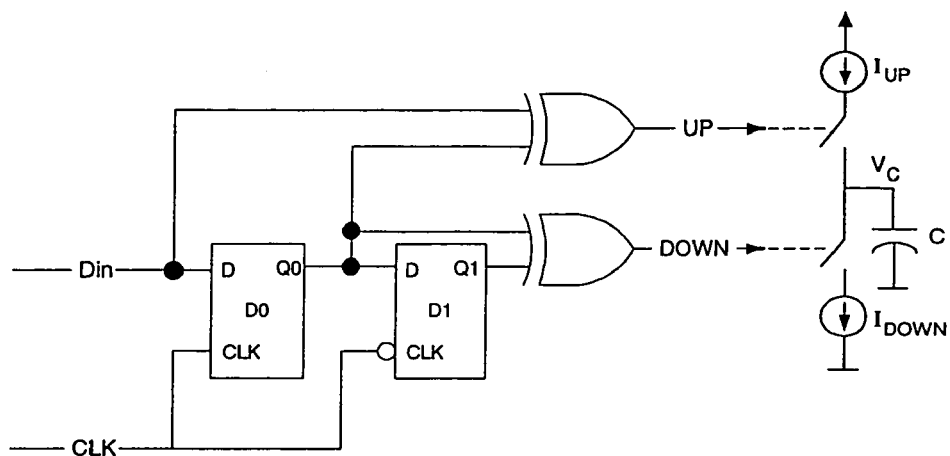
FIG. 3a is a prior art diagram of a Hogge phase detector driving a charge pump.
Figure 3B:
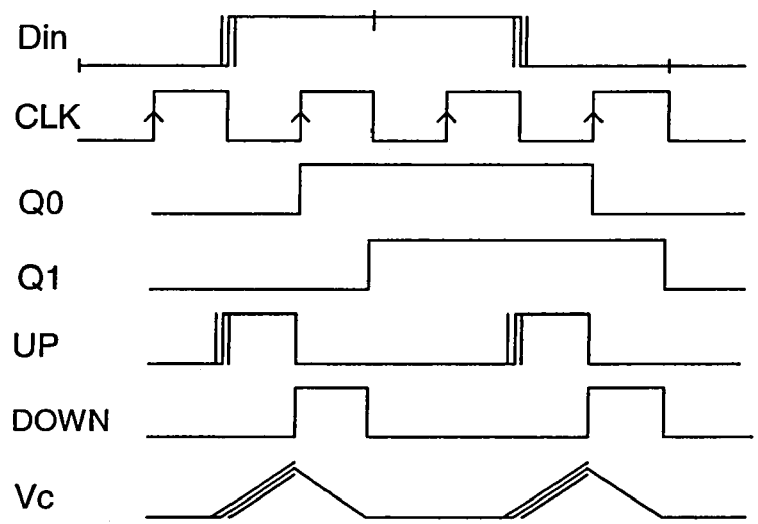
FIG. 3b is a prior art diagram showing the typical waveforms of a Hogge phase detector.
Figure 3C:
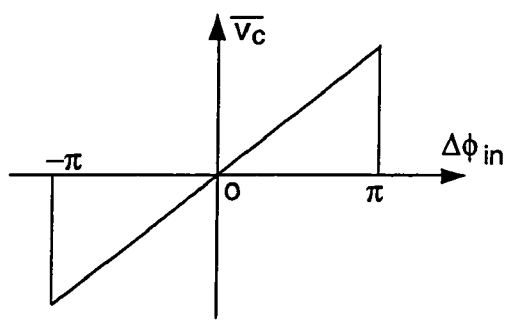
FIG. 3c is a prior art diagram showing the Hogge output characteristic vs. input phase error.

(1) The frequency of correction pulses on the VCO's control line is doubled (see FIG. 4b vs. FIG. 2b). Therefore, the ripple will be attenuated more by going through loop's low-pass filter. Postlayout simulations on PMC-Sierra's PM5284 CSU support the above statements. The unwanted sidebands and the jitter caused by the control voltage ripple will be reduced accordingly.

(2) A CSU, as a frequency multiplier, also amplifies (degrades) the phase noise of reference clock input proportional to its feedback divide ratio. In a CSU based on a PFD, the feedback divide ratio is N and the noise floor of the reference clock is raised by 20×log(N) in decibel terms. In a CSU based on the CSU phase detector and the same reference and output frequencies, the feedback divide ratio is N/2, and the gain (dB) of the CSU on reference clock phase noise is 20×log(N/2). Therefore, in this case the noise floor of the input is raised 6 dB less than the case of a CSU with PFD.

(3) The design is scalable and does not rely on an asynchronous reset element such as the one commonly used in the PFD. For instance, when an existing CSU design is to be scaled to a new frequency or to be ported to a different process technology, the asynchronous reset element in PFD must be carefully adjusted and simulated over process, power supply voltage and temperature (PVT) variations. The variations of the reset pulse width (or equivalently UP and DOWN pulse widths) over the design corners could lead to dead zone and jitter in a PFD-based design, as previously described. In the CSU phase detector, the width of UP and DOWN pulses is set by clock periods in the PLL and hence it is robust against PVT variations. As discussed earlier, in the first embodiment of the phase detector this pulse width is $\frac{1}{4}^{th}$ of the period of REFCLK. In an alternative embodiment of the phase detector (described below) the pulse width is $\frac{1}{8}^{th}$ of the period of REFCLK.

The items (1) and (2) explained above contribute to a CSU with improved jitter performance. Item (3) both ensures a robust phase detector with no dead zone (and no corresponding jitter) and provides a scalable design methodology with no asynchronous element.

Alternate Embodiments

Figure 6A:
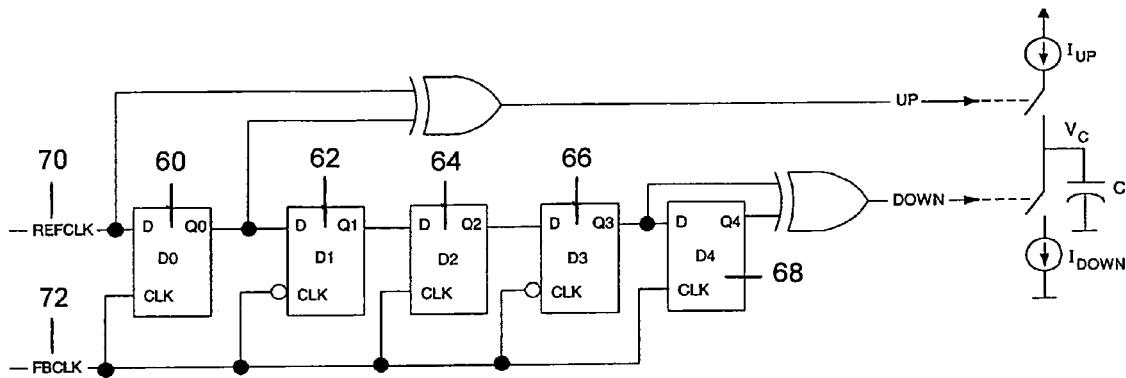
FIG. 6a is a block diagram of an alternative embodiment of the CSU phase detector.

An alternative embodiment of the CSU phase detector is shown in FIG. 6a. Compared to the first embodiment, two more flipflops 66 and 68 are added to the chain of flipflops 60, 62 and 64. Similar to the first embodiment, the consecutive flipflops in the chain are triggered alternatively by positive or negative edges of the feedback clock (FBCLK) 72. The feedback clock, however, is obtained by dividing the VCO frequency by N/4, i.e. the frequency of FBCLK is twice that of the first embodiment. The phase detector output UP is generated by EXOR operation between REFCLK 70 and Q0. The phase detector output DOWN is generated by EXOR operation between Q3 and Q4:

$$UP = REFCLK \oplus Q0$$

$$DOWN = Q3 \oplus Q4$$

Figure 6B:
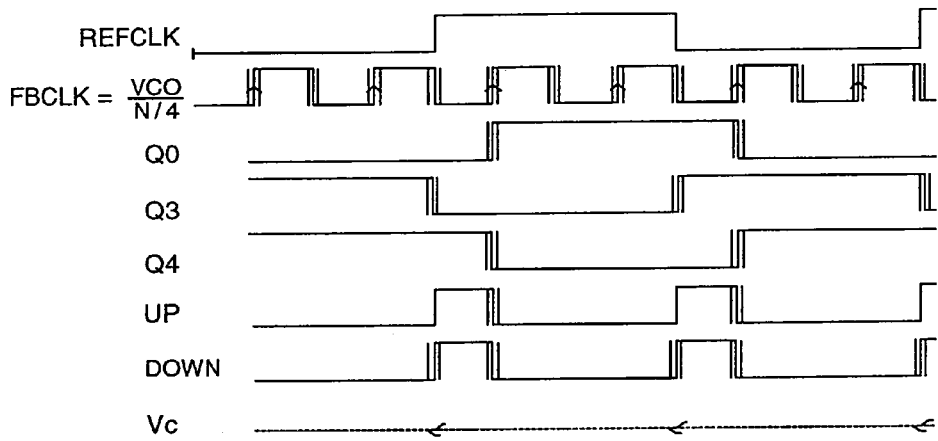
FIG. 6b is a diagram showing the CSU phase detector waveforms for the alternative embodiment.
Figure 6C:
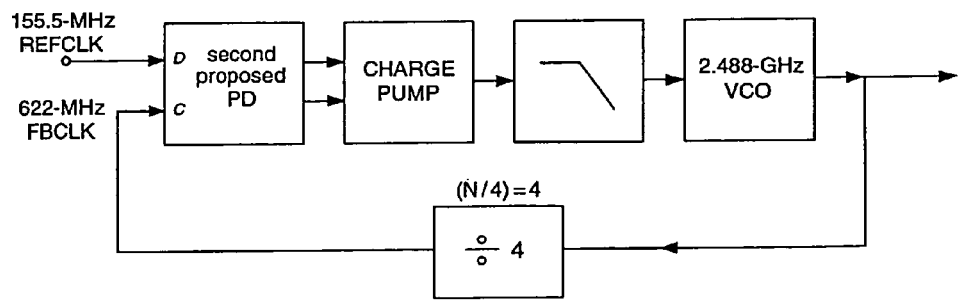
FIG. 6c is a block diagram of the alternative embodiment of the CSU phase detector in a typical application within a CSU.

As shown in FIG. 6b, when the CSU is locked to the reference clock input, UP and DOWN pulses completely overlap, virtually eliminating the charge and discharge activity on VCO's control line. The width of UP and DOWN pulses is derived from the CSU timings and, at locked condition, is $\frac{1}{8}^{th}$ of the period of REFCLK. A block diagram of the 2.488-GHz CSU based on the alternative embodiment of the CSU phase detector is shown in FIG. 6c. Input and output frequencies and the divide ratio are based on SONET OC-48 applications as described for the first embodiment. The numbers can easily be changed based on different design specifications.

If the mismatch current between positive and negative charge pumps controlled by UP and DOWN pulses is not negligible, the alternative embodiment should be a preferred choice over the first embodiment. The reason is that during the overlap time when UP and DOWN are both high, the difference between positive and negative charge pump currents ($I_{UP} - I_{DOWN}$) flows into the loop filter capacitor causing a small unwanted change on control voltage $V_C$. In the alternative embodiment, this overlap time is reduced from $\frac{1}{4}^{th}$ to $\frac{1}{8}^{th}$ of the REFCLK period.

Another point to note in the alternative embodiment is that, compared to the first embodiment, the feedback divide ratio is halved from N/2 to N/4. Therefore, jitter contribution by the feedback divider chain in the PLL is slightly reduced. The compromise, however, is a small jitter that could be introduced by the two flipflops (or in practice, two CML latches) added in the alternative embodiment. In terms of the PLL's loop dynamics, feedback correction rate and the frequency of ripple on the VCO control voltage, the alternative embodiment is very much the same as the first embodiment.

It should be relatively straightforward for a designer skilled in the art to create further alternate embodiments of the phase detector by adding an even number of flipflops in the chain and changing the feedback divide ratio accordingly. However, the added complexity and power may not be justified easily beyond the described alternative embodiment.

Accordingly, while this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is therefore contemplated that the appended claims will cover any such modifications or embodiments as fall within the scope of the invention.

We claim:

1. A phase detector circuit for a phase locked loop (PLL) circuit used in a clock synthesis unit (CSU), said PLL having a voltage controlled oscillator (VCO) at its output, said VCO operating at a VCO frequency, comprising:

(a) a REFCLK input for receiving an input clock signal operating at a REFCLK frequency equal to said VCO frequency divided by N, where N is an even integer greater than or equal to 2;

(b) a FBCLK input for receiving a feedback clock signal taken from an output of said VCO and operating at a FBCLK frequency equal to said VCO frequency divided by $N/(2^J)$, where J is an integer greater than or equal to 1, and $N/(2^J)=N/2, N/4, \ldots, N/N$ is an integer;

(c) a logic circuit coupled to said REFCLK input and said FBCLK input and operative to produce UP pulses and DOWN pulses delayed by $2^J$ half clock cycles of said FBCLK input such that said UP and DOWN pulses substantially overlap when in a phase-locked condition; wherein one of:

(i) positive edges of said UP pulses are fixed and movement of positive edges of said DOWN pulses relative to said positive edges of said UP pulses; and (ii) negative edges of said UP pulses are fixed and movement of negative edges of said DOWN pulses relative to said negative edges of said UP pulses, creates an incremental charge to or from a charge storage circuit and a correction of a loop filter voltage Vc on both positive and negative transitions of REFCLK input.

2. A phase detector circuit according to claim 1, wherein said phase detector circuit produces substantially overlapping UP and DOWN pulses at a rate twice the REFCLK frequency to minimize phase jitter of synthesized clock in said CSU.

3. A phase detector circuit according to claim 1, wherein said logic circuit is comprised of an odd number of flipflops linked in series, every other of said flipflops triggered by positive or negative edges of said FBCLK and the first flipflop in said series having said REFCLK input as its data input and said FBCLK frequency is dependent on the number of flipflops.

4. A phase detector according to claim 3, wherein said odd number of flipflops is equal to three and said FBCLK frequency is equal to said VCO frequency divided by N/2.

5. A phase detector according to claim 3, wherein said odd number of flipflops is equal to five, and said FBCLK frequency is equal to said VCO frequency divided by N/4.

6. A phase detector according to claim 1, and based on differential current-mode logic (CML) implementation, wherein voltage ripple on control lines for said VCO is in the range of 0 to 5 mVpp.

7. A phase detector according to claim 1, wherein said phase detector is comprised only of synchronous elements.

* * * * *